United States Patent
Kong et al.

(10) Patent No.: US 10,950,552 B2
(45) Date of Patent: Mar. 16, 2021

(54) RING-IN-RING CONFIGURABLE-CAPACITANCE STIFFENERS AND METHODS OF ASSEMBLING SAME

(71) Applicant: Intel Corporation, Santa Clara, CA (US)

(72) Inventors: Jackson Chung Peng Kong, Tanjung Tokong (MY); Bok Eng Cheah, Bukit Gambir (MY); Kooi Chi Ooi, Glugor (MY); Paik Wen Ong, Taiping (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/401,661

(22) Filed: May 2, 2019

(65) Prior Publication Data

US 2019/0259704 A1 Aug. 22, 2019

Related U.S. Application Data

(62) Division of application No. 15/845,382, filed on Dec. 18, 2017, now Pat. No. 10,651,127.

(30) Foreign Application Priority Data

Sep. 29, 2017 (MY) .............................. PI2017703694

(51) Int. Cl.
*H01L 21/00* (2006.01)
*H01L 23/538* (2006.01)
(Continued)

(52) U.S. Cl.
CPC ...... *H01L 23/5386* (2013.01); *H01L 21/4853* (2013.01); *H01L 23/49816* (2013.01);
(Continued)

(58) Field of Classification Search
CPC ............ H01L 23/5386; H01L 21/4853; H01L 23/49816; H01L 23/50; H01L 23/562;
(Continued)

(56) References Cited

U.S. PATENT DOCUMENTS 5,699,613 A * 12/1997 Chong ................... H01L 21/486
174/264
5,895,967 A 4/1999 Stearns et al.
(Continued)

FOREIGN PATENT DOCUMENTS

JP 201968052 4/2019

OTHER PUBLICATIONS

"U.S. Appl. No. 15/845,382, Notice of Allowance dated Jan. 15, 2020", 10 pgs.
(Continued)

*Primary Examiner* — Richard A Booth
(74) *Attorney, Agent, or Firm* — Schwegman Lundberg & Woessner, P.A.

(57) ABSTRACT

Ring-in-ring stiffeners on a semiconductor package substrate includes a passive device that is seated across the ring stiffeners. The ring-in-ring stiffeners are also electrically coupled to traces in the semiconductor package substrate through electrically conductive adhesive that bonds a given ring stiffener to the semiconductor package substrate. The passive device is embedded between the two ring stiffeners to create a smaller X-Y footprint as well as a lower Z-direction profile.

20 Claims, 7 Drawing Sheets

(51) Int. Cl.
| | |
|---|---|
| *H01L 23/00* | (2006.01) |
| *H01L 21/48* | (2006.01) |
| *H01L 25/18* | (2006.01) |
| *H01L 25/16* | (2006.01) |
| *H01L 23/498* | (2006.01) |
| *H01L 23/50* | (2006.01) |
| *H05K 3/34* | (2006.01) |
| *H05K 1/18* | (2006.01) |
| *H01L 25/00* | (2006.01) |
| *H01L 23/64* | (2006.01) |
| *H01L 25/065* | (2006.01) |

(52) U.S. Cl.
CPC ............ *H01L 23/50* (2013.01); *H01L 23/562* (2013.01); *H01L 24/16* (2013.01); *H01L 25/16* (2013.01); *H01L 25/18* (2013.01); *H01L 23/538* (2013.01); *H01L 23/64* (2013.01); *H01L 24/81* (2013.01); *H01L 25/0652* (2013.01); *H01L 25/0655* (2013.01); *H01L 25/50* (2013.01); *H01L 2224/16145* (2013.01); *H01L 2224/16227* (2013.01); *H01L 2224/81815* (2013.01); *H01L 2225/06513* (2013.01); *H01L 2225/06517* (2013.01); *H01L 2225/06541* (2013.01); *H01L 2924/1431* (2013.01); *H01L 2924/1432* (2013.01); *H01L 2924/1436* (2013.01); *H01L 2924/1438* (2013.01); *H01L 2924/15192* (2013.01); *H01L 2924/15311* (2013.01); *H01L 2924/19041* (2013.01); *H01L 2924/19105* (2013.01); *H01L 2924/3511* (2013.01); *H05K 1/181* (2013.01); *H05K 3/3494* (2013.01); *H05K 2201/10015* (2013.01); *H05K 2201/1053* (2013.01); *H05K 2201/10159* (2013.01); *H05K 2201/10734* (2013.01)

(58) Field of Classification Search
CPC ......... H01L 24/16; H01L 25/16; H01L 25/18; H01L 2224/16227; H01L 2924/19105; H01L 2924/19041; H01L 2924/1436; H01L 2924/1438; H01L 2924/1432; H01L 25/50; H01L 2224/81815; H01L 24/81; H01L 23/538; H01L 23/64; H01L 25/0652; H01L 25/0655; H01L 2224/16145; H01L 2225/06513; H01L 2225/06517; H01L 2225/06541; H01L 2924/1431; H01L 2924/15192; H01L 2924/15311; H01L 2924/3511; H05K 3/3494; H05K 1/181; H05K 2201/10015; H05K 2201/10159; H05K 2201/1053; H05K 2201/10734
See application file for complete search history.

(56) References Cited

U.S. PATENT DOCUMENTS

| | | | |
|---|---|---|---|
| 6,541,847 | B1 | 4/2003 | Hofstee et al. |
| 7,489,519 | B1 | 2/2009 | Nishi et al. |
| 8,183,680 | B2 | 5/2012 | Zhao et al. |
| 8,405,187 | B2 | 3/2013 | Tosaya et al. |
| 8,643,163 | B2 | 2/2014 | Shim et al. |
| 8,986,806 | B1 | 3/2015 | Baloglu et al. |
| 10,651,127 | B2 | 5/2020 | Kong et al. |
| 2002/0079562 | A1 | 6/2002 | Zhao et al. |
| 2004/0212051 | A1 | 10/2004 | Zhao et al. |
| 2004/0217452 | A1 | 11/2004 | Lindstedt |
| 2005/0280139 | A1 | 12/2005 | Zhao et al. |
| 2007/0278647 | A1 | 12/2007 | Morita |
| 2008/0001308 | A1 | 1/2008 | Chen |
| 2010/0155927 | A1 | 6/2010 | Cheah et al. |
| 2012/0120614 | A1 | 5/2012 | Ueno |
| 2016/0366762 | A1 | 12/2016 | Lin et al. |
| 2017/0170087 | A1 | 6/2017 | Karhade et al. |
| 2017/0179043 | A1 | 6/2017 | Xu et al. |
| 2019/0103359 | A1 | 4/2019 | Kong et al. |

OTHER PUBLICATIONS

"U.S. Appl. No. 15/845,382, Supplemental Notice of Allowability dated Feb. 13, 2020", 2 pgs.
"U.S. Appl. No. 15/845,382, Non Final Office Action dated May 20, 2019", 9 pgs.
"U.S. Appl. No. 15/845,382, Response filed Jul. 17, 2019 to Non-Final Office Action dated May 20, 2019", 4 pgs.
"U.S. Appl. No. 15/845,382, Notice of Non-Compliant Amendment dated Jul. 30, 2019", 2 pgs.
"U.S. Appl. No. 15/845,382, Notice of Allowance dated Jan. 3, 2019", 10 pgs.
"U.S. Appl. No. 15/845,382, Response filed Oct. 24, 2018 to Restriction Requirement dated Aug. 24, 2018", 8 pgs.
"U.S. Appl. No. 15/845,382, Restriction Requirement dated Aug. 24, 2018", 7 pgs.
"European Application Serial No. 18191575.2, Extended European Search Report dated Feb. 25, 2019", 10 pgs.
"U.S. Appl. No. 15/845,382, Response filed Sep. 30, 2019 to Non-Compliant Amendment dated Jul. 30, 2019", 4 pgs.
"European Application Serial No. 18191575.2, Response filed Oct. 2, 2019 to Extended European Search Report dated Feb. 25, 2019", 17 pgs.
U.S. Appl. No. 15/845,382, filed Dec. 18, 2017, Ring-In-Ring Configurable-Capacitance Stiffeners and Methods of Assembling Same.
"European Application Serial No. 18191575.2, Communication Pursuant to Article 94(3) EPC dated Sep. 10, 2020", 9 pgs.

* cited by examiner

RING-IN-RING CONFIGURABLE-CAPACITANCE STIFFENERS AND METHODS OF ASSEMBLING SAME

RELATED APPLICATIONS

This application is a Divisional of U.S. patent application Ser. No. 15/845,382, filed Dec. 18, 2017, which claim the benefit of priority to Malaysian Application Serial Number PI 2017703694, filed Sep. 29, 2017, the disclosures of which are incorporated herein by reference in their entireties.

FIELD

This disclosure relates to semiconductor package stiffeners and to integrated capacitors for smaller form-factor packaging.

BACKGROUND

Semiconductive device miniaturization during packaging includes challenges to locate passive devices in useful proximity to other structures and to manage package physical integrity.

BRIEF DESCRIPTION OF THE DRAWINGS

Disclosed embodiments are illustrated by way of example, and not by way of limitation, in the figures of the accompanying drawings where like reference numerals may refer to similar elements, in which.

DETAILED DESCRIPTION

A die-side capacitor (DSC) is useful because it is locatable near an active device it is servicing. Disclosed embodiments include a DSC that is embedded in a ring-in-ring package stiffener. Both the DSC and the ring-in-ring package stiffener are located on the die side of a semiconductive device package. A trade-off for placing a passive device close to an active device is resolved by embedding the passive device in the ring-in-ring package stiffener. The embedded passive device presents a small X-Y footprint of useful components on the die side of the semiconductive device package, and the ring-in-ring package stiffener-embedded DSC configuration also presents a low Z-direction profile.

This disclosure includes package form-factor miniaturization that includes the elimination of the need for a larger X-Y footprint even though DSC installations are incorporated. Routing capacity is also increased by locating a given DSC at a useful distance from a semiconductive device such as a central processing unit.

By incorporating a DSC into a die-side ring-in-ring package stiffener, the land side of a package substrate is freed up for a fully populated ball-grid array for both I/O and power/ground routing. Consequently, no land-side capacitor (LSC) may be needed. Similarly, placing DSCs within the X-Y footprint as well as the Z-height of the die-side ring-in-ring stiffener, can obviate the need for a recess-in package-board structures including motherboard type structures. The die-side ring-in-ring package stiffener also provides mechanical support to facilitate thin package substrate core layer and/or coreless package stack-up, hence allowing low-Z direction package profile.

Disclosed embodiments exhibit useful power-integrity performance while providing a small X-Y footprint, a low Z-direction profile and still a DSC configuration creates shorter inductance loops and useful capacitor response times.

Figure 1:
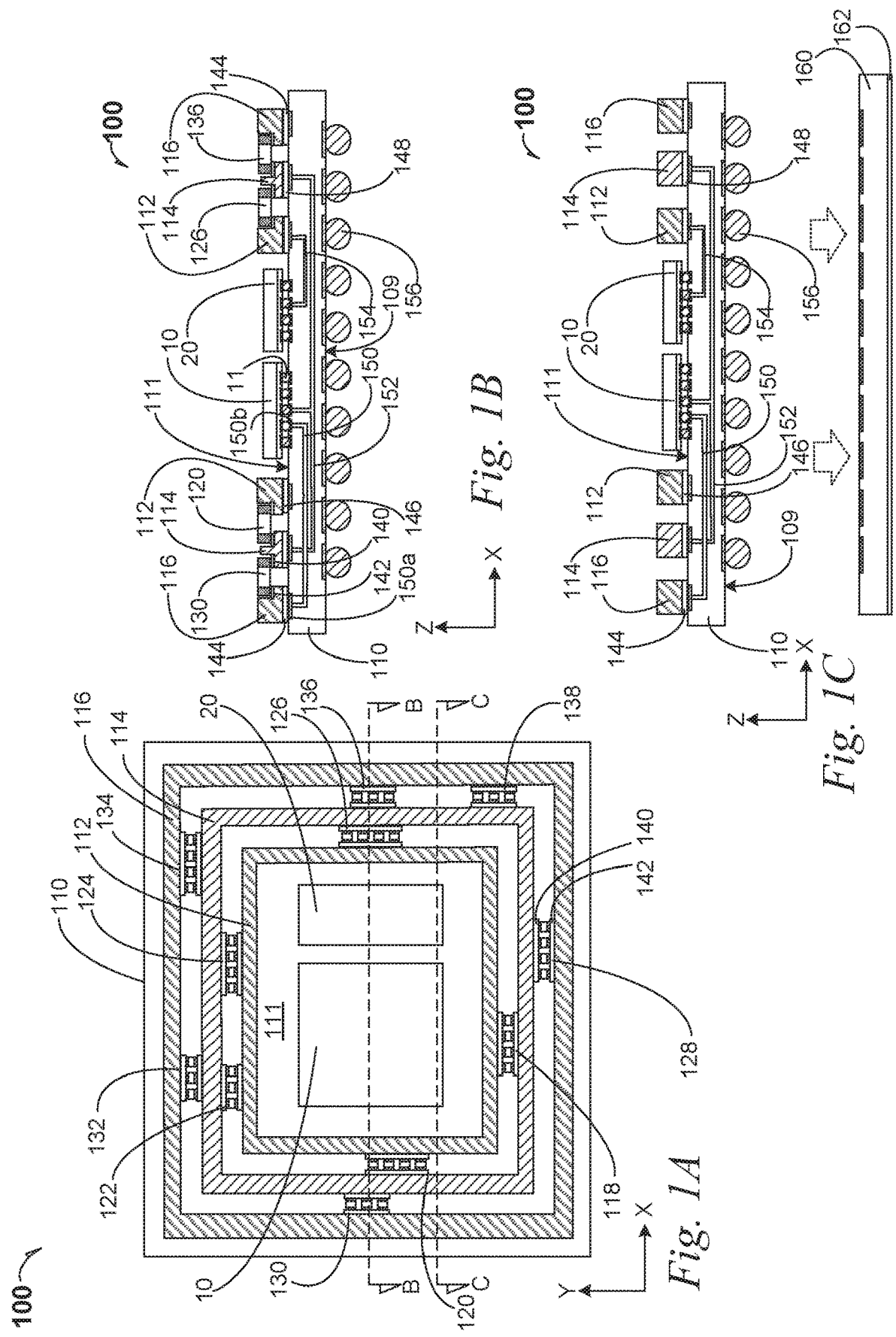
FIG. 1A is a top plan of a semiconductive apparatus that includes package ring stiffeners that incorporate passive components within both the semiconductor package footprint and the Z-profile according to an embodiment.
FIG. 1B is a cross-section and partial cut-away elevation of the semiconductive apparatus depicted in FIG. 1A according to an embodiment.
FIG. 1C is a cross-section and partial cut-away elevation of the semiconductive apparatus depicted in FIG. 1A according to an embodiment.

FIG. 1A is a top plan of a semiconductive apparatus 100 that includes package ring stiffeners that incorporate passive components within both the semiconductor package footprint and the Z-profile according to an embodiment. The package ring stiffeners are mounted on a semiconductor package substrate 110 on a die side 111. As illustrated, the ring stiffeners are rectangular instead of circular, but it is understood as a stiffener surrounds a portion of a semiconductor package, it may be referred to as a "ring stiffener," and it may take on a form such as a rectangle frame, a circular frame, a square frame, a trapezoid frame, or a rhombus frame. Additionally, sections of a ring stiffener may amount to substantially surrounding a portion of a semiconductor package, the sum of which may also be referred to as a ring stiffener.

In an embodiment, the semiconductor package ring stiffeners include component parts including an inner ring stiffener 112 and a subsequent ring stiffener 114. In an embodiment, an outer ring stiffener 116 is also included that, with the inner ring stiffener 112, sandwich the subsequent ring stiffener 114. In an embodiment, only two ring stiffeners are used such that the inner ring stiffener 112 and the subsequent ring stiffener 114 are electrically connected in the circuitry as respective power supply voltage (VCC) and ground reference voltage (VSS) portions.

In an embodiment, active devices are disposed on the die side 111, such as a first die 10 and a supplemental die 20. In an embodiment, the first die 10 is a logic processor such as manufactured by Intel Corporation of Santa Clara, Calif. In an embodiment where the first die 10 is a processor, the supplemental die 20 is a platform-controller hub 20. As illustrated, the first die 10 and the supplemental die 20 are seated side-by-side in the infield region of the die side 111, where the infield region is created by the inner contours of the inner ring stiffener 112.

In an embodiment, several dice are seated on the die side 111 such as a CPU die, a PCH die, a DRAM die, a graphic processing unit (GPU) die. As illustrated a ball array 11 supports the first die 10 upon the die side 111 and forms electronic coupling between the first die and the semiconductor package substrate 110. Throughout the several figures, ball arrays such as the ball array 11 are illustrated for seating dice upon the die side 111 as illustrated for the first die 10.

In an embodiment, a series of passive devices such as capacitors is supplied between the inner ring stiffener 112 and the subsequent ring stiffener 114. As illustrated, five capacitor groups are provided, beginning at the bottom of the inner ring stiffener 112 with a four-capacitor group 118, and moving clockwise, a four-capacitor group 120, a three-capacitor group 122, a four-capacitor group 124, and a four-capacitor group 126. As illustrated by the space available, other-numbers capacitor groups may be assembled such as a five-capacitor group in an embodiment. In an embodiment, a two-capacitor group is deployed. In an embodiment, a single capacitor is deployed.

In an embodiment, a series of passive devices such as capacitors is supplied between the subsequent ring stiffener 114 and the outer ring stiffener 116. As illustrated, six capacitor groups are provided, beginning at the bottom of the outer ring stiffener 116 with a four-capacitor group 128, and moving clockwise, a three-capacitor group 130, a three-capacitor group 132, a four-group 134, a three-capacitor group 136 and a three-capacitor group 138. As illustrated by the space available, other-numbers capacitor groups may be assembled such as a five-capacitor group in an embodiment. In an embodiment, a two-capacitor group is deployed. In an embodiment, a single capacitor is deployed.

Electrical connection of passive devices is provided by electrical material such as solder layers. The solder layers include two distinct solder layers, 140 and 142 illustrated with the four-capacitor group 128 between the subsequent ring stiffener 114 and the outer ring stiffener 116, that connect the passive device 128 to the two adjacent ring stiffeners. Each passive device is also illustrated with solder layers to connect between two adjacent ring stiffeners; in one instance to the inner ring stiffener 112 and the subsequent stiffener 114, and in another instance to the subsequent ring stiffener 114 and the outer ring stiffener 116.

In an embodiment, the ring stiffeners are made from aluminum metal plate. In an embodiment, the ring stiffeners are made from copper metal plate. In an embodiment, the ring stiffeners present a Z-direction profile in a range from 100 micrometer (μm) to 400 μm.

In any event, it can be seen in FIG. 1A that three ring stiffeners are mounted on the die side 111 and each is separated any adjacent ring stiffener by a gap that is bridged by at least one passive device. In an embodiment, the gap is bridged by a dummy device that provides no significant electrical functionality between the two adjacent ring stiffeners.

FIG. 1B is a cross-section and partial cut-away elevation of the semiconductive apparatus 100 depicted in FIG. 1A according to an embodiment. FIG. 1B taken from the section line B-B in FIG. 1A. In cross section, the apparatus 100 depicts the capacitors 120, 126, 130 and 136. The capacitors 120 and 126 are positioned between the inner ring stiffener 112 and the subsequent ring stiffener 114. The capacitors 130 and 136 are positioned between the subsequent ring stiffener 114 and the outer ring stiffener 116.

Other passive devices can be located between any two adjacent stiffener parts in the gap illustrated for example between the inner ring stiffener 112 and the subsequent ring stiffener 114. In any event, the passive component provides an electrical coupling path between the adjacent ring stiffeners.

By way of illustration, the capacitor 130 is illustrated with end electrodes or terminals (darker) and the capacitor body (lighter), and the capacitor 130 is electrically coupled by direct contact to the solder layer. As illustrated in FIG. 1B, the solder layers 140 and 142 are seated upon ledges that have been formed in the several ring stiffeners. In turn, the solder layers 140 and 142 are electrically coupled to the respective subsequent and outer ring stiffeners 114 and 116 through the passive components such as the capacitors 130 and 136.

In cross-section and partial cut-away view of FIG. 1B, the package substrate 110 illustrates electrical routing and conductive adhesives between the electrical routing and the ring stiffeners. The outer ring stiffener 116 is affixed to the land side surface 111 by an electrically conductive adhesive film 144. Similar respective electrically conductive films 146 and 148 affix the inner and subsequent ring stiffeners 112 and 114.

Electrical routing 150, 152 and 154 is depicted within the semiconductor package substrate 110 under the several ring stiffeners 112, 114 and 116. Not all electrical routing is illustrated, and not illustrated is electrical routing that is directed orthogonal to the plane of the drawing that is coupled to a semiconductive device such as the CPU 10 depicted in FIG. 1A.

In an embodiment, a ball-grid array is disposed on a land side 109 of the semiconductor package substrate 110, one electrical bump of which is indicated by reference number 156.

The electrical routing 150 illustrates routing that allows for circuitry to be directed across the capacitor 130 beginning at e.g., the outer ring stiffener 116 and completing at ball array 11. The electrical routing 150 couples a first terminal of the capacitor 130 to the logic die 10. In an embodiment, the electrical routing 150 is associated with a first power supply voltage (Vcc). The electrical routing 152 couples a second terminal of the capacitors 120, 130, 126 and 136 to the logic die 10. In an embodiment, the electrical routing 152 is associated with a ground reference voltage (Vss). The electrical routing 154 couples the supplemental die 20 to the capacitor 126. In an embodiment, the electrical routing 154 is associated with a second power supply voltage (Vcc). In an embodiment, the electrical routing 150, 152 and 154 may include vertical interconnects such as one or more micro-vias. The terminals of electrical routing 150, 152 and 154 are coupled to a package substrate contact pad such as contact pad 150a (i.e. adjacent to the stiffener such as stiffener 116) and a package substrate bump contact pad such as contact pad 150b (i.e. adjacent to logic die 10) respectively. In an embodiment, the electrical routing 150 is referred to as a first trace that is coupled to the first die 10, and the electrical routing 154 is referred to as a supplemental trace that is coupled to the supplemental die 20. It can be seen that electrical routings 150, 152 and 154 are illustrative but not exhaustive illustrations of electrical routings.

In an embodiment, the adhesive films e.g., anisotropic conductive films are electrically conductive, which adhere the several ring stiffeners to the die side 111. For example, as illustrate in FIG. 1B, the adhesive films 144, 146 and 148 are electrically conductive to allow use of the several embedded capacitors. In an embodiment, the capacitor and ring stiffener e.g., capacitor 130 and outer ring stiffener 116 are electrically coupled to the logic die 10 through the adhesive film 144, the package substrate contact pad 150a, the electrical routing 150 and the package substrate bump contact pad 150b. In an embodiment, the adhesive films have a thickness in a range from 20 µm to 30 µm.

In an embodiment, the passive components are capacitors such as XLP 0402, 0201, 01005. In an embodiment, the passive components are capacitors with pole-to-pole lengths from 400 µm to 1,000 µm. In an embodiment, the passive components are capacitors with widths from 200 µm to 500 µm. In an embodiment, the passive components are capacitors with Z-direction profiles from 150 µm to 250 µm.

FIG. 1C is a cross-section and partial cut-away elevation of the semiconductive apparatus 100 depicted in FIG. 1A according to an embodiment. The apparatus 100 depicts the logic device 10, the supplemental device 20, as well as the ring stiffeners 112, 114 and 116 as seen from FIG. 1A taken from the section line C-C. The logic and supplemental devices 10 and 20, respectively, are flip-chip bonded to the die side 111 of the package substrate 110. The package substrate 110 illustrates the ring stiffeners 112, 114 and 116 are affixed to the die side surface 111 by the respective adhesive films 144, 146 and 148.

As depicted in FIG. 1C and in an embodiment for all package substrates in this disclosure such as the package substrate 110, the electrical ball-grid array 156 is seated onto a board 160 such as a motherboard 160. In an embodiment, the board 160 includes a physical and electrically insulative shell 162 such as the outer shell of a computing system. Processing to seat the package substrate 110 onto the board 160 is illustrated by the directional arrows, depicted in dashed lines, that illustrate movement of the package substrate 110 toward the board 160.

Figure 2:
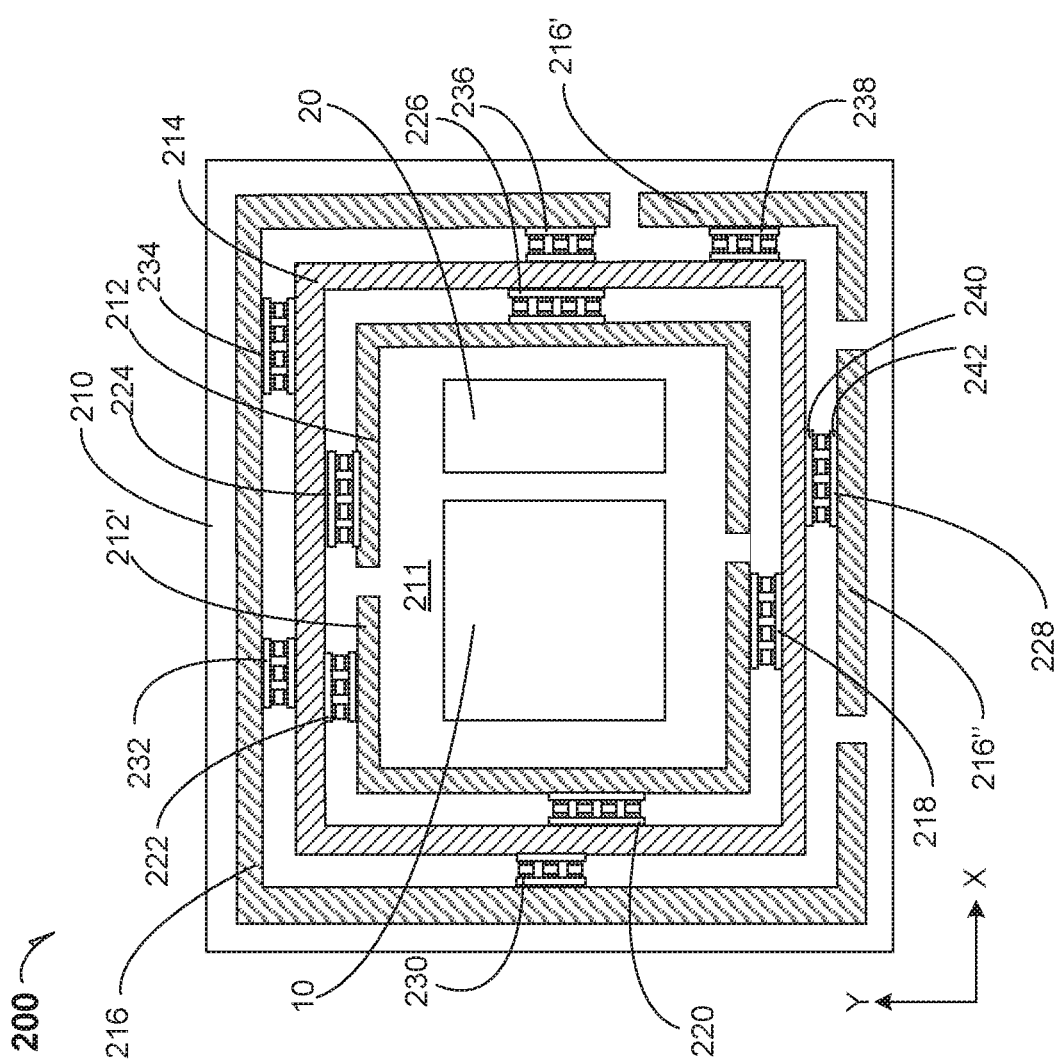
FIG. 2 is a top plan of a semiconductive apparatus that includes package ring stiffeners and ring-segment stiffeners that incorporate passive components within both the semiconductor package footprint and the Z-profile according to an embodiment.

FIG. 2 is a top plan of a semiconductive apparatus 200 that includes package ring stiffeners and ring-segment stiffeners that incorporate passive components within both the semiconductor package footprint and the Z-profile according to an embodiment. The package ring stiffeners and ring-segment stiffeners are mounted on a semiconductor package substrate 210 on a die side 211. In an embodiment, the semiconductor package ring stiffeners and ring-segment stiffeners include component parts including inner ring-segment stiffeners 212 and 212'. It can be seen whereas a subsequent ring stiffener 214 is an integral structure, absent the two spaces that separate the inner ring-segment stiffeners 212 and 212', the two stiffeners delineate a ring form factor on the die side 211. The subsequent ring stiffener 214 is associated with a ground reference voltage (VSS) and as such, is a single and complete ring stiffener.

In an embodiment, outer ring-segment stiffeners include items 216, 216' and 216". The outer ring-segment stiffeners 216, 216' and 216" included with the inner ring-segment stiffeners 212 and 212', sandwich the subsequent ring stiffener 214. It can be seen whereas the subsequent ring stiffener 214 is an integral structure, absent the several spaces that separate the outer ring-segment stiffeners 216, 216' and 216", the three stiffeners delineate a ring form factor on the die side 211. The subsequent ring stiffener 214 is associated with a ground reference voltage (VSS) and as such, is a single and complete ring stiffener.

In an embodiment, only two ring stiffener sets are used such that the inner ring-segment stiffeners 212 and 212' and the subsequent ring stiffener 214 are electrically connected in the circuitry as respective power supply voltage (VCC) and ground reference voltage (VSS) portions.

In an embodiment, active devices are disposed on the die side 211, such as a first die 10 and a supplemental die 20. In an embodiment, the first die 10 is a logic processor such as manufactured by Intel Corporation of Santa Clara, Calif. In an embodiment where the first die 10 is a processor, the supplemental die 20 is a platform-controller hub 20. As illustrated, the first die 10 and the supplemental die 20 are seated side-by-side in the infield region of the die side 211, where the infield region is created by the inner contours of the inner ring-segment stiffeners 212 and 212'.

In an embodiment, several dice are seated on the die side 211 such as a CPU die, a PCH die, a DRAM die, a graphic processing unit (GPU) die. In these embodiments, the die 10 is a first semiconductive device 10 and the die 20 is a subsequent semiconductive device 20.

The semiconductive devices 10 and 20, or one of them, may be located in an infield area of the die side 211, where the reference numeral 211 is located and that is within the central contours of the inner ring-segment stiffeners 212 and 212'.

In an embodiment, a series of passive devices such as capacitors is supplied between the inner ring-segment stiffeners 212 and 212', and the subsequent ring stiffener 214. As illustrated, five capacitor groups are provided, beginning at the bottom of the inner ring-segment stiffener 212' with a four-capacitor group 218, and moving clockwise, a four-capacitor group 220, and a three-capacitor group 222. Proceeding further clockwise with the ring-segment stiffener 212, a four-capacitor group 224, and a four-capacitor group 226. Where a first passive device 226 may contact the inner ring-segment stiffener 212 and be referred to as an inner passive device 226, at least one supplemental passive device 220 may contact the inner ring-segment stiffener 212', and it may be referred to as at least one more inner passive device 220.

In an embodiment, a series of passive devices such as capacitors is supplied between the subsequent ring stiffener 214 and the outer ring-segment stiffeners 216, 216' and 216". Where a first passive device 230 may contact the outer ring-segment stiffener 216 and be referred to as an outer passive device 230, at least one supplemental passive device 238 may contact the outer ring-segment stiffener 216', and it may be referred to as at least one more outer passive device 238.

As illustrated, six capacitor groups are provided, beginning at the bottom of the outer ring-segment stiffeners 216, 216' and 216" with a four-capacitor group 228, and moving clockwise, a three-capacitor group 230, a three-capacitor group 232, a four-capacitor group 234, a three-capacitor group 236 and a three-capacitor group 238. In an embodiment, a two-capacitor group is employed. In an embodiment, a single capacitor is employed.

Electrical connection of passive devices is provided by electrical material such as solder layers 240 and 242. The solder layers include two distinct solder layers, 240 and 242 illustrated with the four-capacitor group 228 between the subsequent ring stiffener 214 and the outer ring-segment stiffener 216", that connect the passive device 228 to the two adjacent ring stiffeners. Each passive device is also illustrated with solder layers to connect between two adjacent ring stiffeners.

In an embodiment, the several ring-segment stiffeners are associated with power rail with a single power supply voltage such as 1 volt (V). In an embodiment, the several ring-segment stiffeners are associated with power rails with two different power supply voltages such as 1.5 V and 3.3 V. For example, the ring-segment stiffeners 212, 216 and 216" carry 1.5 V and the ring-segment stiffeners 212' and 216' carry the voltage 3.3 V. In an embodiment, each ring-segment stiffener carries a different power supply voltage.

For example, the ring-segment stiffener 212 carries the power supply voltage Vcc1=1V, the ring-segment stiffener 212' carries the voltage Vcc2=1.5V, the ring-segment stiffener 216" carries the voltage Vcc3=1.8V, the ring-segment stiffener 216' carries the voltage Vcc4=3.3V and the ring-segment stiffener 216 carries the voltage Vcc5=0.5V.

Figure 3:
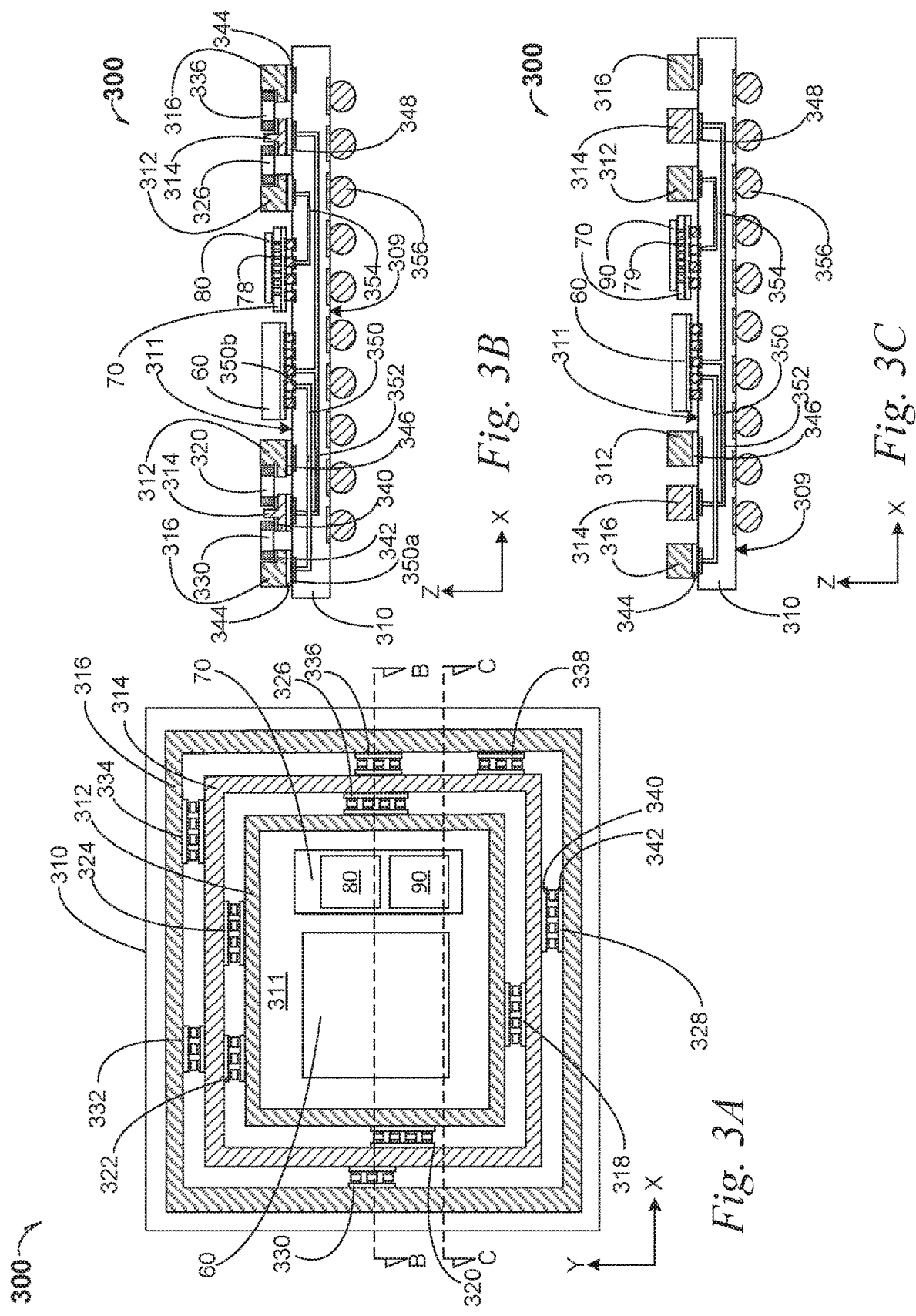
FIGS. 3A, 3B and 3C illustrate stacked-die apparatus that use the ring-in-ring, stiffener-bedded passive devices according to an embodiment.

FIGS. 3A, 3B and 3C illustrate stacked-die apparatus 300 that use the ring-in-ring, stiffener-embedded passive devices according to an embodiment. Similar structures and configurations may be referenced from FIGS. 1A, 1B and 1C.

FIG. 3A illustrates a processor die 60. In an embodiment, a supplemental die 70, a stacked supplemental first die 80 and a stacked supplemental subsequent die 90 are configured adjacent the processor die 60. The stacked supplemental first die 80 is connected through the backside of the supplemental die 70 by several through-silicon vias (TSVs) 78 (see FIG. 3B). The stacked supplemental subsequent die 90 is connected through the backside of the supplemental die 70 by several TSVs 79 (see FIG. 3C). The several TSVs 78 and 79 are illustrated in respective FIGS. 3B and 3C by two groupings of nominal eight TSVs 78 and 79. In an embodiment, the supplemental die 70 is a platform controller hub, the stacked supplemental first die 80 is a memory die, and the stacked supplemental subsequent die 90 is a transceiver. The overall Z-direction profile of the ring stiffeners is higher than the highest part of the memory and/or transceiver dice 80 and 90, such that the die stack 70, 80 and 90 is physically protected by the stiffener parts in the Z-profile. In an embodiment, the overall Z-direction profile of the ring stiffeners is at about the same level with the highest part of the die stack 70, 80 and 90.

Figure 4:
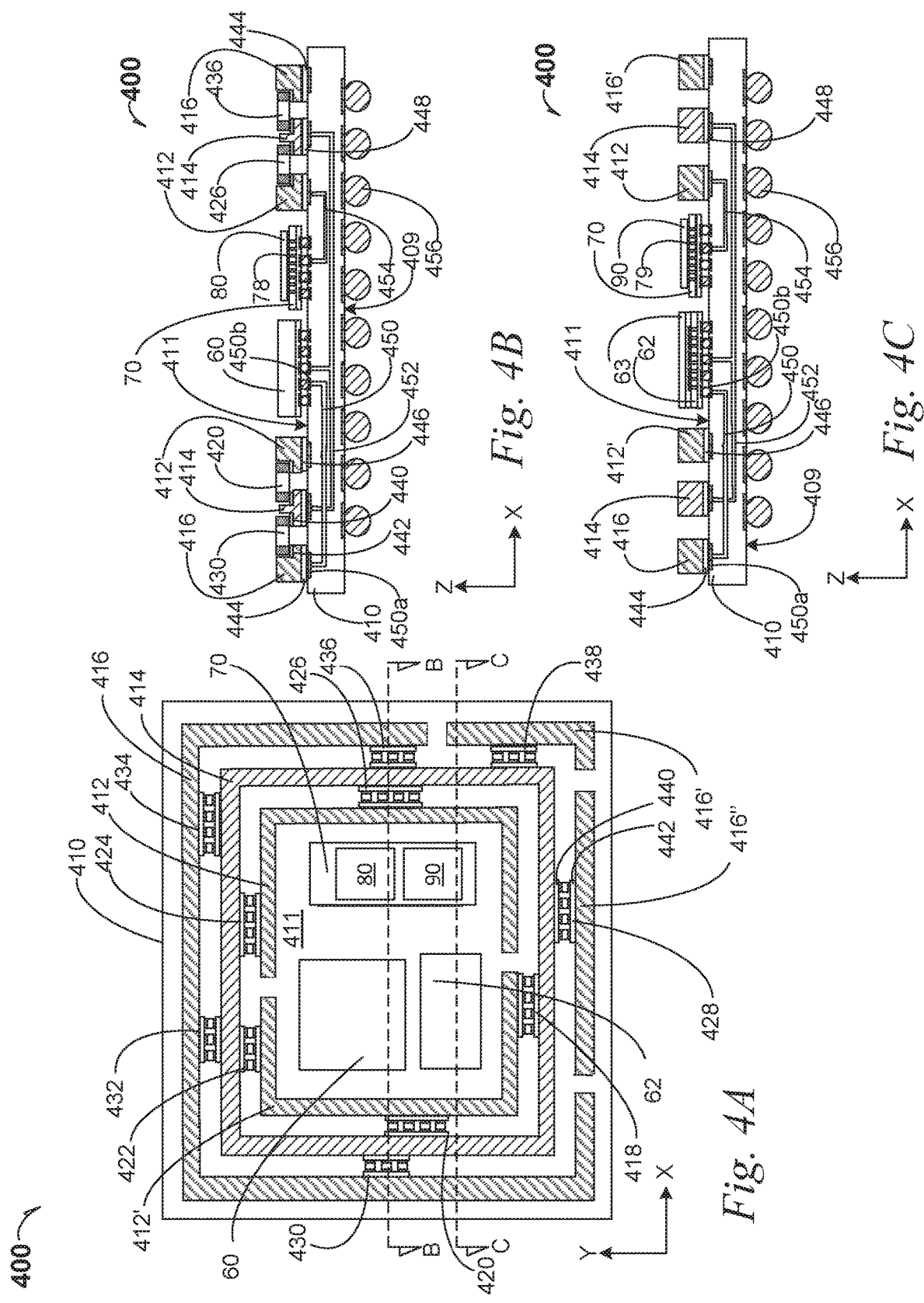
FIGS. 4A, 4B and 4C illustrate a stacked-die apparatus that use the ring-segment ring-in-ring, stiffener-embedded passive devices according to an embodiment.

FIGS. 4A, 4B and 4C illustrate a stacked-die apparatus 400 that use the ring-segment ring-in-ring, stiffener-embedded passive devices according to an embodiment. Selected similar structures and configurations may be referenced from FIGS. 2 and 3.

The semiconductor package ring stiffeners and ring-segment stiffeners are mounted on a semiconductor package substrate 410 on a die side 411. In an embodiment, the semiconductor package ring stiffeners and ring-segment stiffeners include component parts including inner ring-segment stiffeners 412 and 412'. A subsequent ring stiffener 414 is associated with a ground reference voltage (VSS) and as such, is a single and complete ring stiffener.

In an embodiment, outer ring-segment stiffeners include items 416, 416' and 416". The outer ring-segment stiffeners 416, 416' and 416" included with the inner ring-segment stiffeners 412 and 412', sandwich the subsequent ring stiffener 414. In an embodiment, only two ring stiffeners are used such that the inner ring-segment stiffeners 412 and 412' and the subsequent ring stiffener 414 are electrically connected in the circuitry as respective power supply voltage (VCC) and ground reference voltage (VSS) portions.

In an embodiment, active devices are disposed on the die side 411, such as a first die 60, a memory-die stack 62 and a supplemental die 70. In an embodiment, the first die 60 is a logic processor such as manufactured by Intel Corporation of Santa Clara, Calif. In an embodiment where the first die 60 is a processor, the memory-die stack includes a first memory die 62 that is flip-chip mounted on the die side 411, and a subsequent memory die 63 that is stacked on the first memory die 62 and that is connected by through-silicon vias 69 to the first memory die 62. In an embodiment, the memory die stack 62 and 63 are a dynamic random access memory (DRAM) or a flash memory.

As illustrated, the first die 60 and the memory die stack 62 and 63 are seated side-by-side in the infield region of the die side 411, along with a supplemental die 70 that is configured with a stacked supplemental first die 80 and a stacked supplemental subsequent die 90. The stacked supplemental first die 80 is connected through the backside of the supplemental die 70 by several through-silicon vias (TSVs) 78 (see FIG. 4B). The stacked supplemental subsequent die 90 is connected through the backside of the supplemental die 70 by several TSVs 79 (see FIG. 4C). The several TSVs 78 and 79 are illustrated in respective FIGS. 4B and 4C by two groupings of nominal eight TSVs 78 and 79. In an embodiment, the supplemental die 70 is a platform controller hub, the stacked supplemental first die 80 is a graphics processor, and the stacked supplemental subsequent die 90 is a transceiver. The overall Z-direction profile of the ring stiffener and the ring-segment stiffeners is higher than the highest part of the dice 60, 62, 80 and 90, such that the die stacks are physically protected by the stiffener segment parts in the Z-profile. In an embodiment, the overall Z-direction profile of the ring stiffeners is at about the same level with the highest part of the dice 60, 62, 80 and 90.

In an embodiment, a series of passive devices such as capacitors is supplied between the inner ring-segment stiffeners 412 and 412', and the subsequent ring stiffener 414. As illustrated, five capacitor groups are provided, beginning at the bottom of the inner ring-segment stiffener 412 and 412' with a four-capacitor group 418, and moving clockwise, a four-capacitor group 420, a three-capacitor group 422, a four-capacitor group 424, and a four-capacitor group 426.

In an embodiment, a series of passive devices such as capacitors is supplied between the subsequent ring stiffener 414 and the outer ring-segment stiffeners 416, 416' and 416". As illustrated, six capacitor groups are provided, beginning at the bottom of the outer ring-segment stiffeners 416, 416' and 416" with a four-capacitor group 428, and moving clockwise, a three-capacitor group 430, a three-capacitor group 432, a four-capacitor group 434, a three-capacitor group 436 and a three-capacitor group 438.

Electrical connection of passive devices is provided by electrical material such as solder layers 440 and 442. The solder layers include two distinct solder layers, 440 and 442 illustrated with the four-capacitor group 428 between the subsequent ring stiffener 414 and the outer ring-segment stiffener 416", that connect the passive device 428 to the two adjacent ring stiffeners. Each passive device is also illustrated with solder layers to connect between two adjacent ring stiffeners through the respective terminals.

In an embodiment, the several ring-segment stiffeners are associated with power rail with a single power supply voltage such as 1 volt (V). In an embodiment, the several ring-segment stiffeners are associated with power rails with two different power supply voltages such as 1.5 V and 3.3 V. For example, the ring-segment stiffeners 412, 416 and 416" carry 1.5 V and the ring-segment stiffeners 412' and 416' carry the voltage 3.3 V. In an embodiment, each ring-segment stiffener carries a different power supply voltage. For example, the ring-segment stiffener 412 carries the voltage Vcc1=1V, the ring-segment stiffener 412' carries the voltage Vcc2=1.5V, the ring-segment stiffener 416" carries the voltage Vcc3=1.8V, the ring-segment stiffener 416' carries the voltage Vcc4=3.3V and the ring-segment stiffener 416 carries the voltage Vcc5=0.5V. In an embodiment, each die type operates at a voltage that is different from each other die type. For example, the processor 60 operates at 1V, the memory die stack 62 and 63 operate at 1.5V, the platform controller hub 70 operates at 1.8V, the transceiver 78 operates at 0.5V and the graphics processor 80 operates at 3.3V. In an embodiment, one or more die types operate or share a common power supply voltage. In an embodiment, each die type operates at one or more power supply voltages.

In any event, it can be see that several dice can be assembled upon a package substrate such as the package substrate 410, and the several ring-segment stiffeners of the 412 and 416 series can operate as power rails to deliver capacitive discharges to the several dice types according to a useful dedicated power rail voltage.

Figure 5:
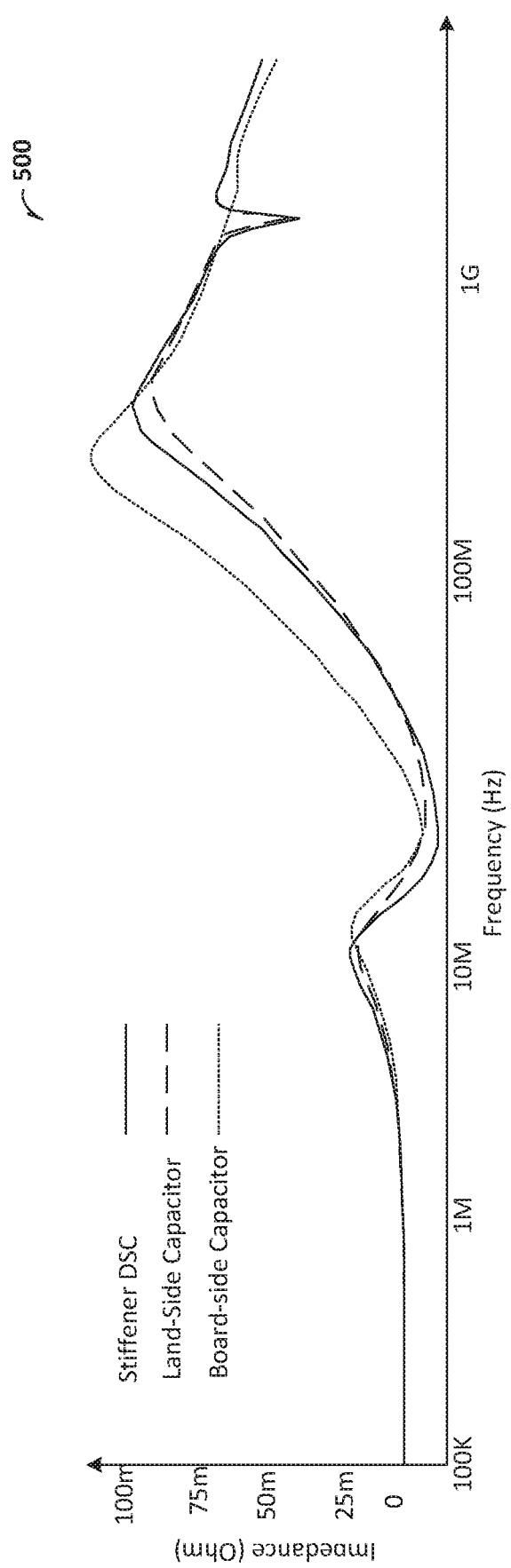
FIG. 5 is a performance comparison according to an embodiment.

FIG. 5 is a performance comparison graphic 500 according to an embodiment. The graphic is generated from simulation and is disclosed to illustrate performance for the instant embodiments compared to land-side and die-side capacitor performance. Quantitative amounts are approximate and illustrative. The stiffener die-side capacitor performance is found at the knee between 100 MHz and 1 GHz to be between the land-side capacitor (LSC) and the board-side capacitor (BSC), but closer to the LSC. In addition to demonstrating an improvement over a BSC, disclosed embodiments resolve larger X-Y footprint issues as well as Z-height issues, in the LSC as well as the BSC comparisons.

Figure 6:
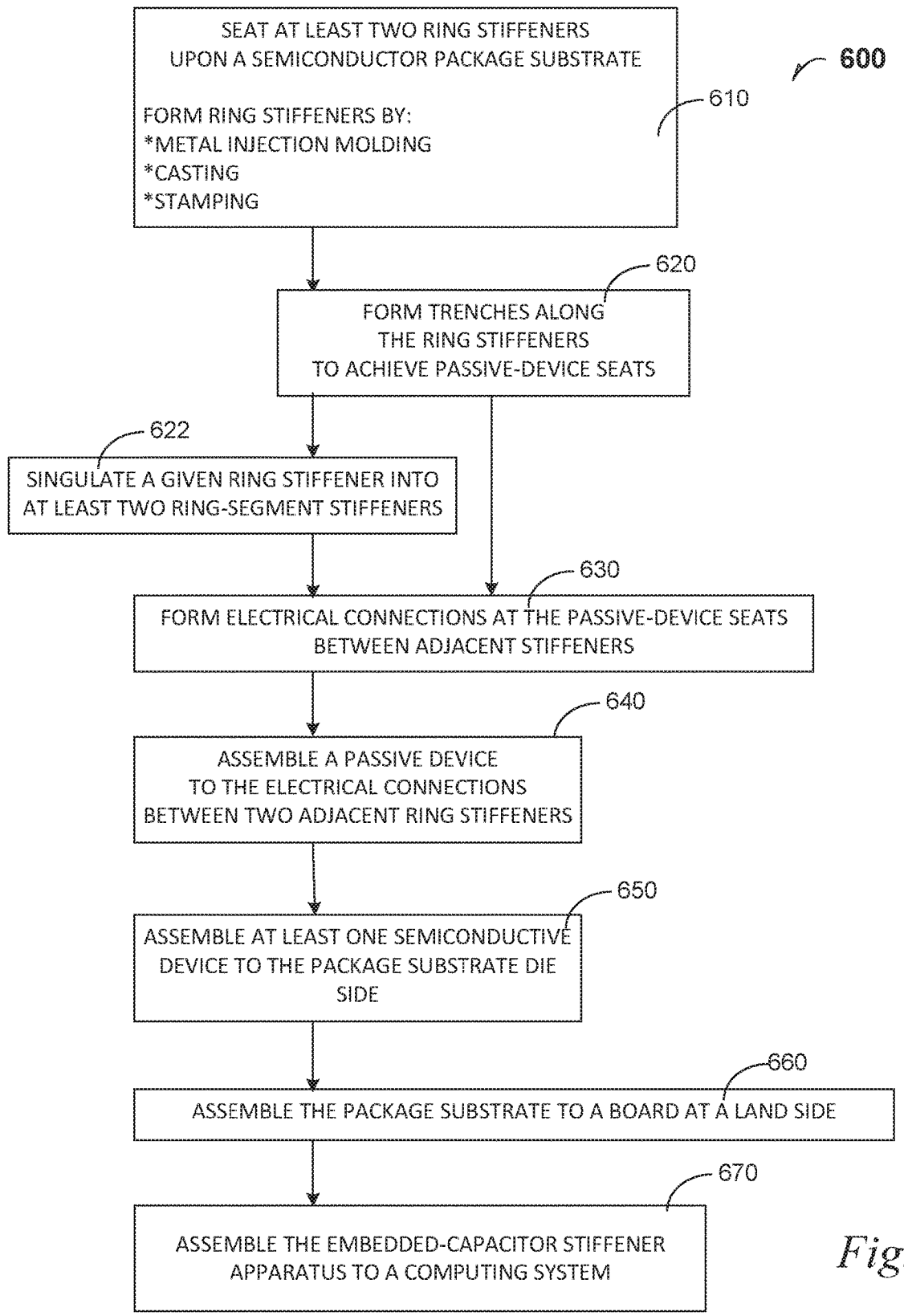
FIG. 6 is a process flow diagram according to an embodiment.

FIG. 6 is a process flow diagram 600 according to an embodiment.

At 610, the process includes seating at least two ring stiffeners upon a semiconductor package substrate. In an embodiment, the conductive adhesive films such as adhesive films 144, 146, 148 (as seen in FIG. 1B) may be laminated on the package substrate to facilitate the adhesion of the ring stiffeners. Forming of the ring stiffeners is done by metal injection molding in an embodiment. Forming of the ring stiffeners is done by metal casting in an embodiment. Forming of the ring stiffeners is done by metal stamping in an embodiment.

At 620, the process includes forming trenches or ledges along selected portions of the ring stiffeners to achieve seats for passive devices. In an embodiment directed to stamping before 620, the passive-device seats are achieved by the stamping process.

At 622, the process includes singulating a given ring stiffener into at least two ring-segment stiffeners.

At 630, the process includes forming electrical connections at the passive-device seats. In a non-limiting example embodiment, solder 140 and 142 are formed upon seats or ledges on the respective ring stiffeners 116 and 114 as seen in FIG. 1A. In an embodiment, the forming of electrical connections such as solder 140 and 142 can be achieved through solder paste dispensing or printing process.

At 640, the process includes assembling a passive device to the electrical connections between two adjacent ring stiffeners. In a non-limiting example embodiment, the several capacitors depicted in FIG. 3B are seated onto the solder electrical connections through example a pick and place process.

At 650, the process includes assembling at least one semiconductive device to the package substrate die side. In a non-limiting example embodiment, the first die 10 and the supplemental die 20 are seated upon the die side 111 (as seen in FIGS. 1B and 1C) through example solder reflow process. In an embodiment, the electrical connections between the at least one passive devices and the stiffeners described in process 640) may be formed during the same reflow process.

At 660, the process includes assembling the semiconductor package substrate to a board at a land side of the package. In a non-limiting example embodiment, the semiconductor package substrate 110 is assembled to the board 160 as illustrated by the two directional arrows in ghosted lines in FIG. 1C through example solder reflow process.

At 670, the process includes assembling the ring-in-ring stiffener containing semiconductor package to a computing system. Further illustration of this process is described below.

Figure 7:
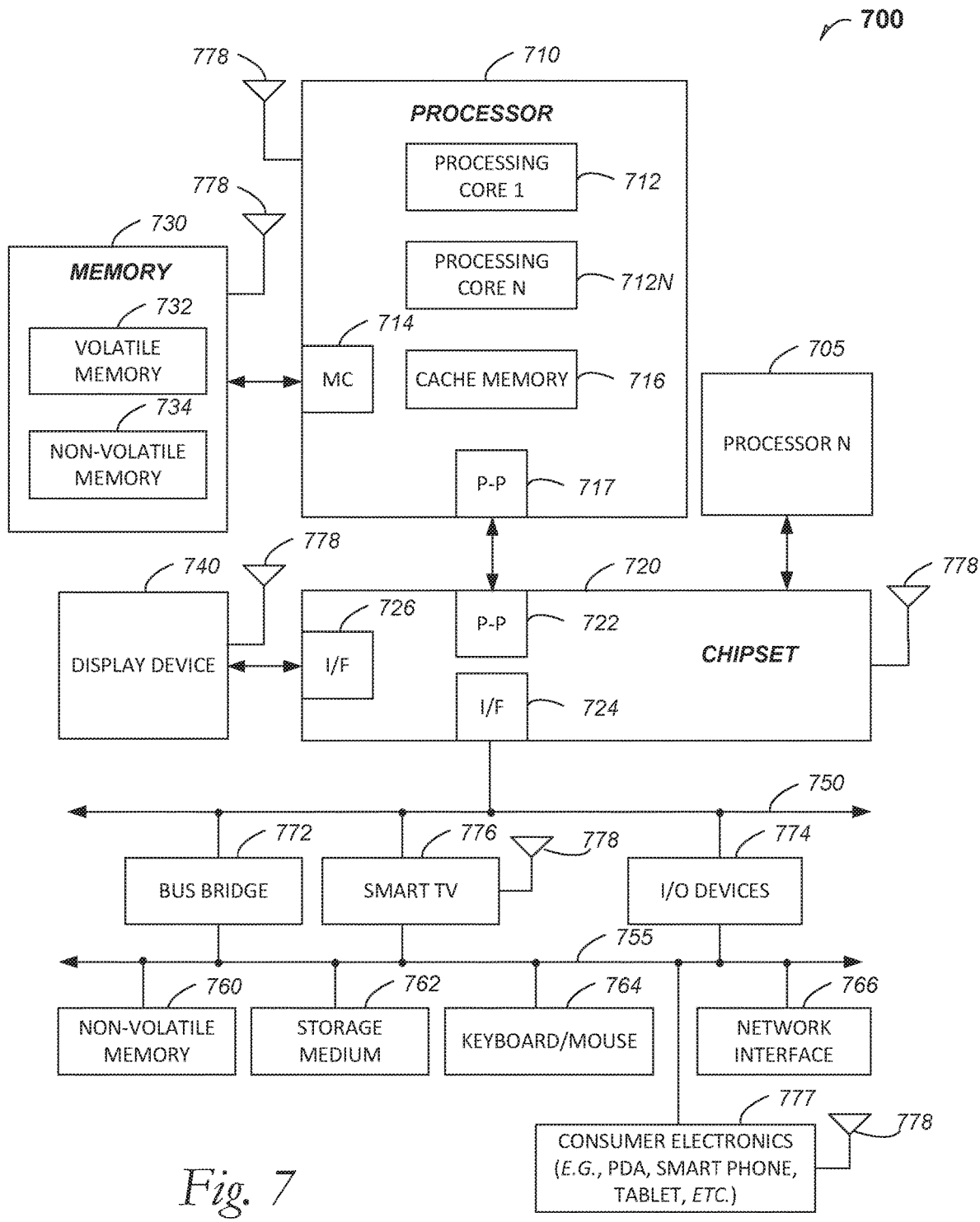
FIG. 7 is included to show an example of a higher-level device application for the disclosed embodiments.

FIG. 7 is included to show an example of a higher-level device application for the disclosed embodiments. The ring-in-ring, stiffener-embedded passive device for semiconductive apparatus embodiments may be found in several parts of a computing system. In an embodiment, the ring-in-ring, stiffener-embedded passive device for semiconductive apparatus is part of a communications apparatus such as is affixed to a cellular communications tower. The ring-in-ring, stiffener-embedded passive device for semiconductive apparatus may also be referred to as composite stiffener incorporating a passive device apparatus. In an embodiment, a computing system 700 includes, but is not limited to, a desktop computer. In an embodiment, a system 700 includes, but is not limited to a laptop computer. In an embodiment, a system 700 includes, but is not limited to a netbook. In an embodiment, a system 700 includes, but is not limited to a tablet. In an embodiment, a system 700 includes, but is not limited to a notebook computer. In an embodiment, a system 700 includes, but is not limited to a personal digital assistant (PDA). In an embodiment, a system 700 includes, but is not limited to a server. In an embodiment, a system 700 includes, but is not limited to a workstation. In an embodiment, a system 700 includes, but is not limited to a cellular telephone. In an embodiment, a system 700 includes, but is not limited to a mobile computing device. In an embodiment, a system 700 includes, but is not limited to a smart phone. In an embodiment, a system 700 includes, but is not limited to an internet appliance. Other types of computing devices may be configured with the microelectronic device that includes ring-in-ring, stiffener-embedded passive device for semiconductive apparatus embodiments.

In an embodiment, the processor 710 has one or more processing cores 712 and 712N, where 712N represents the Nth processor core inside processor 710 where N is a positive integer. In an embodiment, the electronic device system 700 using a ring-in-ring, stiffener-embedded passive device embodiment that includes multiple processors including 710 and 705, where the processor 705 has logic similar or identical to the logic of the processor 710. In an embodiment, the processing core 712 includes, but is not limited to, pre-fetch logic to fetch instructions, decode logic to decode the instructions, execution logic to execute instructions and the like. In an embodiment, the processor 710 has a cache memory 716 to cache at least one of instructions and data for the MAA apparatus in the system 700. The cache memory 716 may be organized into a hierarchal structure including one or more levels of cache memory.

In an embodiment, the processor 710 includes a memory controller 714, which is operable to perform functions that enable the processor 710 to access and communicate with memory 730 that includes at least one of a volatile memory 732 and a non-volatile memory 734. In an embodiment, the processor 710 is coupled with memory 730 and chipset 720. The processor 710 may also be coupled to a wireless antenna 778 to communicate with any device configured to at least one of transmit and receive wireless signals. In an embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 734 includes, but is not limited to, flash memory, phase change memory (PCM), read-only memory (ROM), electrically erasable programmable read-only memory (EEPROM), or any other type of non-volatile memory device.

The memory 730 stores information and instructions to be executed by the processor 710. In an embodiment, the memory 730 may also store temporary variables or other intermediate information while the processor 710 is executing instructions. In the illustrated embodiment, the chipset 720 connects with processor 710 via Point-to-Point (PtP or P-P) interfaces 717 and 722. Either of these PtP embodiments may be achieved using a MAA apparatus embodiment as set forth in this disclosure. The chipset 720 enables the processor 710 to connect to other elements in the ring-in-ring, stiffener-embedded passive device for semiconductive apparatus embodiments in a system 700. In an embodiment, interfaces 717 and 722 operate in accordance with a PtP communication protocol such as the Intel® QuickPath Interconnect (QPI) or the like. In other embodiments, a different interconnect may be used.

In an embodiment, the chipset 720 is operable to communicate with the processor 710, 705N, the display device 740, and other devices 772, 776, 774, 760, 762, 764, 766, 777, etc. The chipset 720 may also be coupled to a wireless antenna 778 to communicate with any device configured to at least do one of transmit and receive wireless signals.

The chipset 720 connects to the display device 740 via the interface 726. The display 740 may be, for example, a liquid crystal display (LCD), a plasma display, cathode ray tube (CRT) display, or any other form of visual display device. In an embodiment, the processor 710 and the chipset 720 are merged into a ring-in-ring, stiffener-embedded passive device for semiconductive apparatus in a system. Additionally, the chipset 720 connects to one or more buses 750 and 755 that interconnect various elements 774, 760, 762, 764, and 766. Buses 750 and 755 may be interconnected together via a bus bridge 772 such as at, least, one ring-in-ring, stiffener-embedded passive device for semiconductive apparatus embodiment. In an embodiment, the chipset 720, via interface 724, couples with a non-volatile memory 760, a mass storage device(s) 762, a keyboard/mouse 764, a network interface 766, smart TV 776, and the consumer electronics 777, etc.

In an embodiment, the mass storage device 762 includes, but is not limited to, a solid state drive, a hard disk drive, a universal serial bus flash memory drive, or any other form of computer data storage medium. In one embodiment, the network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the ring-in-ring, stiffener-embedded passive device for semiconductive apparatus embodiment in a computing system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into the processor core 712.

Where useful, the computing system 700 may have a broadcasting structure interface such as for affixing the ring-in-ring, stiffener-embedded passive device for semiconductive apparatus to a cellular tower.

To illustrate the ring-in-ring, stiffener-embedded passive device for semiconductive apparatus embodiments and methods disclosed herein, a non-limiting list of examples is provided herein:

Example 1 is a semiconductor package substrate, comprising: a die side and a land side; an inner ring stiffener and a subsequent ring stiffener disposed adjacent the inner ring stiffener, wherein each ring stiffener is seated on the die side with an electrically conductive adhesive, and wherein at least one electrically conductive adhesive is coupled to a trace within the package substrate; and a passive device electrically contacting the inner ring stiffener and the subsequent ring stiffener, wherein the subsequent ring stiffener is coupled to ground and the inner ring stiffener is coupled to a power connection.

In Example 2, the subject matter of Example 1 optionally includes wherein the passive device is a first passive device, further including at least one more passive device electrically contacting the inner ring stiffener and the subsequent ring stiffener.

In Example 3, the subject matter of any one or more of Examples 1-2 optionally include a first die disposed on the die side, wherein the first die is coupled to the subsequent ring stiffener through the trace.

In Example 4, the subject matter of any one or more of Examples 1-3 optionally include wherein the trace is a first trace further including: a first die disposed on the die side, wherein the first die is coupled to the subsequent ring stiffener through the first trace; and a supplemental die disposed on the die side, wherein the supplemental die is coupled to the subsequent ring stiffener through a supplemental trace.

In Example 5, the subject matter of any one or more of Examples 1-4 optionally include wherein the subsequent ring stiffener is an integral ring structure, and wherein the inner ring stiffener comprises two ring-segment stiffeners that collectively delineate a ring stiffener.

In Example 6, the subject matter of any one or more of Examples 1-5 optionally include wherein the subsequent ring stiffener is an integral ring stiffener, further including an outer ring-segment stiffener comprising at least two outer ring-segment stiffeners that collectively delineate a ring stiffener.

In Example 7, the subject matter of any one or more of Examples 1-6 optionally include wherein the subsequent ring stiffener is an integral ring structure, further including: an inner ring stiffener comprises two ring-segment stiffeners that collectively delineate a ring stiffener, and an outer ring-segment stiffener comprising at least two outer ring-segment stiffeners that collectively delineate a ring stiffener surrounding the subsequent ring stiffener.

In Example 8, the subject matter of any one or more of Examples 1-7 optionally include wherein the passive device is an inner passive device, further including: an outer ring stiffener, wherein the subsequent ring stiffener is disposed on the die side between the inner ring stiffener and the outer ring stiffener; and at least one outer passive device electrically contacting the outer ring stiffener and the subsequent ring stiffener, wherein the outer ring stiffener is coupled to power connections.

In Example 9, the subject matter of Example 8 optionally includes wherein the inner passive device is a first inner passive device, further including at least one more inner passive device electrically contacting the inner ring stiffener and the subsequent ring stiffener, wherein the outer passive device is a first outer passive device, further including at least one more outer passive devices contacting the subsequent ring stiffener and the outer ring stiffener.

In Example 10, the subject matter of any one or more of Examples 8-9 optionally include a first die disposed on the die side, wherein the first die is coupled to the subsequent ring stiffener through the trace.

In Example 11, the subject matter of any one or more of Examples 8-10 optionally include wherein the trace is a first trace further including: a first die disposed on the die side, wherein the first die is coupled to the subsequent ring stiffener through the first trace; and a supplemental die disposed on the die side, wherein the supplemental die is coupled to the subsequent ring stiffener through a supplemental trace.

In Example 12, the subject matter of any one or more of Examples 8-11 optionally include wherein the subsequent ring stiffener is an integral ring structure, and wherein the inner ring stiffener comprises two ring-segment stiffeners that collectively delineate a ring stiffener.

In Example 13, the subject matter of any one or more of Examples 8-12 optionally include wherein the subsequent ring stiffener is an integral ring stiffener, further including an outer ring-segment stiffener comprising at least two out ring segment stiffeners that collectively delineate a ring stiffener.

In Example 14, the subject matter of any one or more of Examples 8-13 optionally include wherein the subsequent ring stiffener is an integral ring structure, further including: an inner ring stiffener comprises two ring-segment stiffeners that collectively delineate a ring stiffener, and an outer ring-segment stiffener comprising at least two outer ring-segment stiffeners that collectively delineate a ring stiffener surrounding the subsequent ring stiffener.

In Example 15, the subject matter of any one or more of Examples 1-14 optionally include a ball-grid array disposed on the land side; and a board which the ball-grid array contacts, wherein the board is a printed wiring board.

In Example 16, the subject matter of any one or more of Examples 1-15 optionally include the passive device is a capacitor with a length in a range from 200 µm to 500 µm, a width in a range from 400 µm to 1,000 µm, and a height in a range from 150 µm to 250 µm.

Example 17 is a method of assembling a stiffener to a semiconductor package substrate, comprising: seating an inner ring stiffener and a subsequent ring stiffener upon a die side of a semiconductor package substrate, wherein the semiconductor package substrate also includes a land side; forming a trench in each of the inner ring stiffener and the subsequent ring stiffener to achieve a passive-device seat; forming electrical connections at the passive-device seat between the inner ring stiffener and the subsequent ring stiffener; and assembling a passive device to the electrical connections between the ring stiffeners.

In Example 18, the subject matter of Example 17 optionally includes wherein the inner ring stiffener is assembled from two or more inner ring-segment stiffeners, wherein the passive device is a first inner passive device, further including: assembling a subsequent inner passive device to the subsequent ring stiffener and a different inner ring-segment stiffener.

In Example 19, the subject matter of any one or more of Examples 17-18 optionally include wherein the passive device is an inner passive device, further including: seating an outer ring stiffener on the die side and adjacent the subsequent ring stiffener; forming a trench in each of the subsequent ring stiffener and the outer ring stiffener to achieve a passive-device seat; forming electrical connections at the passive-device seat between the subsequent ring stiffener and the outer ring stiffener; and assembling an outer passive device to the electrical connections between the subsequent ring stiffener and the outer ring stiffener.

In Example 20, the subject matter of any one or more of Examples 17-19 optionally include wherein the outer ring stiffener is assembled from two or more outer ring-segment stiffeners, wherein the outer passive device is a first outer passive device, further including: assembling a subsequent outer passive device to the subsequent ring stiffener and a different outer ring-segment stiffener.

Example 21 is a computing system, comprising: a first die and a supplemental die seated on semiconductor package substrate die side, wherein the semiconductor package substrate also includes a land side; an inner ring stiffener and a subsequent ring stiffener disposed adjacent the inner ring stiffener, wherein each ring stiffener is seated on the die side with an electrically conductive adhesive, and wherein at least one electrically conductive adhesive is coupled to a trace within the package substrate; and a passive device electrically contacting the inner ring stiffener and the subsequent ring stiffener, wherein the subsequent ring stiffener is coupled to ground and the inner ring stiffener is coupled to power connections; a ball-grid array disposed on the land side; and a board electrically contacting the ball-grid array, wherein the board includes an outer shell that is electrically and physically insulative for the first die and the supplemental die.

In Example 22, the subject matter of Example 21 optionally includes wherein the supplemental die supports a first stacked supplemental die and a subsequent stacked supplemental die, each of which is coupled to the supplemental die by at least one through-silicon via, and wherein each of the first and supplemental dice communicate to the semiconductor package through a ball array.

In Example 23, the subject matter of Example 22 optionally includes a memory-die stack disposed on the die side, wherein the memory-die stack includes a chipset with at least two memory dice that communicate to the semiconductor package substrate through at least one TSV.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A method of assembling a stiffener to a semiconductor package substrate, comprising:

seating an inner ring stiffener and a subsequent ring stiffener upon a die side of a semiconductor package substrate, wherein the semiconductor package substrate also includes a land side;

forming a trench in each of the inner ring stiffener and the subsequent ring stiffener to achieve a passive-device seat, wherein the seat is wider than a spacing between the inner ring and the subsequent ring;

forming electrical connections at the passive-device seat between the inner ring stiffener and the subsequent ring stiffener; and assembling a passive device to the electrical connections between the ring stiffeners.

2. The method of claim 1, wherein the inner ring stiffener is assembled from two or more inner ring-segment stiffeners, wherein the passive device is a first inner passive device, further including:

assembling a subsequent inner passive device to the subsequent ring stiffener and a different inner ring-segment stiffener.

3. The method of claim 1, wherein the passive device is an inner passive device, further including:

seating an outer ring stiffener on the die side and adjacent the subsequent ring stiffener;

forming a trench in each of the subsequent ring stiffener and the outer ring stiffener to achieve a passive-device seat;

forming electrical connections at the passive-device seat between the subsequent ring stiffener and the outer ring stiffener; and assembling an outer passive device to the electrical connections between the subsequent ring stiffener and the outer ring stiffener.

4. The method of claim 1, wherein the outer ring stiffener is assembled from two or more outer ring-segment stiffeners, wherein the outer passive device is a first outer passive device, further including:

assembling a subsequent outer passive device to the subsequent ring stiffener and a different outer ring-segment stiffener.

5. A computing system, comprising:

a first die and a supplemental die seated on semiconductor package substrate die side, wherein the semiconductor package substrate also includes a land side;

an inner ring stiffener and a subsequent ring stiffener disposed adjacent the inner ring stiffener, wherein each ring stiffener is seated on the die side with an electrically conductive adhesive, and wherein at least one electrically conductive adhesive is coupled to a trace within the package substrate;

a passive device electrically contacting the inner ring stiffener and the subsequent ring stiffener, wherein the subsequent ring stiffener is coupled to ground, and the inner ring stiffener is coupled to power connections; and a ball-grid array disposed on the land side.

6. The computing system of claim 5, wherein the supplemental die supports a first stacked supplemental die and a subsequent stacked supplemental die, each of which is coupled to the supplemental die by at least one through-silicon via, and wherein each of the first and supplemental dice communicate to the semiconductor package through a ball array.

7. The computing system of claim 5, further including a memory-die stack disposed on the die side, wherein the memory-die stack includes a chipset with at least two memory dice that communicate to the semiconductor package substrate through at least one through-silicon via.

8. The computing system of claim 5, further including a board electrically contacting the ball-grid array, wherein the board includes an outer shell that is electrically and physically insulative for the first die and the supplemental die.

9. A computing system, comprising:
- a first die and a supplemental die seated on semiconductor package substrate die side, wherein the semiconductor package substrate also includes a land side;
- a stacked supplemental die on the supplemental die, wherein the stacked supplemental die is coupled to the supplemental die by a through-silicon via;
- an inner ring stiffener and a subsequent ring stiffener disposed adjacent the inner ring stiffener, wherein each ring stiffener is seated on the die side with an electrically conductive adhesive, wherein at least one ring stiffener is divided into a number of physically separate portions, and wherein at least one electrically conductive adhesive is coupled to a trace within the package substrate;
- a passive device electrically contacting the inner ring stiffener and the subsequent ring stiffener, wherein the subsequent ring stiffener is coupled to ground, and the inner ring stiffener is coupled to power connections; and
- a ball-grid array disposed on the land side.

10. The computing system of claim 9, wherein the first die is a processor die.

11. The computing system of claim 9, wherein the stacked supplemental die is a stacked supplemental first die, further including:
- a stacked supplemental subsequent die on the stacked supplemental first die, wherein the stacked supplemental subsequent die is coupled to the stacked supplemental first die by a through-silicon via.

12. The computing system of claim 9, wherein the stacked supplemental die is a stacked supplemental first die, further including:
- a stacked supplemental subsequent die on the stacked supplemental first die, wherein the stacked supplemental subsequent die is coupled to the stacked supplemental first die by a through-silicon via, wherein the supplemental die is a platform controller hub, and wherein the stacked supplemental subsequent die is a transceiver.

13. The computing system of claim 9, wherein the first die is a processor die, further including:
- a stacked supplemental subsequent die on the stacked supplemental first die, wherein the stacked supplemental subsequent die is coupled to the stacked supplemental first die by a through-silicon via, wherein the supplemental die is a platform controller hub, and wherein the stacked supplemental subsequent die is a transceiver.

14. The computing system of claim 9, further including:
a board electrically contacting the ball-grid array, wherein the board includes an outer shell that is electrically and physically insulative for the first die and the supplemental die.

15. A computing system, comprising:
- a first die and a supplemental die seated on semiconductor package substrate die side, wherein the semiconductor package substrate also includes a land side;
- a memory-die stack including a first memory die and a subsequent memory die that is stacked on the first memory die, wherein the subsequent memory die is connected to the first memory die by a through-silicon via in the first memory die;
- a stacked supplemental die on the supplemental die, wherein the stacked supplemental die is coupled to the supplemental die by a through-silicon via;
- an inner ring stiffener and a subsequent ring stiffener disposed adjacent the inner ring stiffener, wherein each ring stiffener is seated on the die side with an electrically conductive adhesive, and wherein at least one electrically conductive adhesive is coupled to a trace within the package substrate;
- a passive device electrically contacting the inner ring stiffener and the subsequent ring stiffener, wherein the subsequent ring stiffener is coupled to ground, and the inner ring stiffener is coupled to power connections; and
- a ball-grid array disposed on the land side.

16. The computing system of claim 15, wherein the first die is a processor die.

17. The computing system of claim 15, wherein the stacked supplemental die is a stacked supplemental first die, further including:
- a stacked supplemental subsequent die on the stacked supplemental first die, wherein the stacked supplemental subsequent die is coupled to the stacked supplemental first die by a through-silicon via.

18. The computing system of claim 15, wherein the stacked supplemental die is a stacked supplemental first die, further including:
- a stacked supplemental subsequent die on the stacked supplemental first die, wherein the stacked supplemental subsequent die is coupled to the stacked supplemental first die by a through-silicon via; and
- wherein the supplemental die is a platform controller hub, and wherein the stacked supplemental subsequent die is a transceiver.

19. The computing system of claim 15, wherein the first die is a processor die, wherein the stacked supplemental die is a stacked supplemental first die, further including:
- a stacked supplemental subsequent die on the stacked supplemental first die, wherein the stacked supplemental subsequent die is coupled to the stacked supplemental first die by a through-silicon via; and
- wherein the supplemental die is a platform controller hub, and wherein the stacked supplemental subsequent die is a transceiver.

20. The computing system, of claim 14, further including a board electrically contacting the ball-grid array, wherein the board includes an outer shell that is electrically and physically insulative for the first die and the supplemental die.

* * * * *